(12) United States Patent
Owada et al.

(10) Patent No.: US 11,654,524 B2
(45) Date of Patent: May 23, 2023

(54) METHOD OF DETECTING ABNORMALITY OF A ROLLER WHICH TRANSMITS A LOCAL LOAD TO A RETAINER RING, AND POLISHING APPARATUS

(71) Applicant: EBARA CORPORATION, Tokyo (JP)

(72) Inventors: Tomoko Owada, Tokyo (JP); Osamu Nabeya, Tokyo (JP); Yuta Suzuki, Tokyo (JP); Shingo Togashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 264 days.

(21) Appl. No.: 17/002,013

(22) Filed: Aug. 25, 2020

(65) Prior Publication Data

US 2021/0060723 A1 Mar. 4, 2021

(30) Foreign Application Priority Data

Aug. 27, 2019 (JP) .............................. JP2019-154300

(51) Int. Cl.
*B24B 37/005* (2012.01)
*H01L 21/304* (2006.01)

(52) U.S. Cl.
CPC .......... *B24B 37/005* (2013.01); *H01L 21/304* (2013.01)

(58) Field of Classification Search
CPC ....... B24B 37/005; B24B 49/16; B24B 49/10; B24B 7/228; B24B 37/04; B24B 37/042;
(Continued)

(56) References Cited

U.S. PATENT DOCUMENTS 6,293,845 B1 * 9/2001 Clark-Phelps .......... B24B 49/16
451/10
2014/0030957 A1 * 1/2014 Aratani ................... B24B 37/30
451/11

(Continued)

FOREIGN PATENT DOCUMENTS

| JP | 2009-028856 A | 2/2009 |
| JP | 2014-004675 A | 1/2014 |
| JP | 2015-233131 A | 12/2015 |

*Primary Examiner* — Don M Anderson
*Assistant Examiner* — Caleb Andrew Holizna
(74) *Attorney, Agent, or Firm* — BakerHostetler

(57) ABSTRACT

A method of detecting abnormality of a roller which transmits a local load to a retainer ring is disclosed. The method comprises: rotating a polishing head which includes a head body and a retainer ring, the head body having a pressing surface for pressing a substrate, the retainer ring being arranged so as to surround the pressing surface; measuring a torque for rotating the polishing head, while rotating a rotary ring together with the polishing head and while exerting a local load to a stationary ring located on the rotary ring, the rotary ring being fixed to the retainer ring and having a plurality of rollers; generating a torque waveform indicating relationship between measured values of the torque for rotating the polishing head and measuring times of the torque; performing Fourier-transform process on the torque waveform to determine an intensity of frequency component of the torque waveform; and determining that at least one of the rollers malfunctions when the determined intensity of the frequency component is larger than a predetermined threshold value.

6 Claims, 9 Drawing Sheets

(58) Field of Classification Search
CPC ....... B24B 37/07; B24B 37/10; B24B 37/105; B24B 37/107; H01L 21/304
USPC .......................................................... 451/1
See application file for complete search history.

(56) References Cited

U.S. PATENT DOCUMENTS

| | | | |
|---|---|---|---|
| 2015/0165585 A1* | 6/2015 | Ogata | B24B 37/08 451/5 |
| 2015/0328743 A1* | 11/2015 | Nabeya | B24B 41/007 451/288 |
| 2018/0090347 A1* | 3/2018 | Kitagawa | A46B 13/02 |

* cited by examiner

METHOD OF DETECTING ABNORMALITY OF A ROLLER WHICH TRANSMITS A LOCAL LOAD TO A RETAINER RING, AND POLISHING APPARATUS

CROSS REFERENCE TO RELATED APPLICATION

This document claims priority to Japanese Patent Application Number 2019-154300 filed Aug. 27, 2019, the entire contents of which are hereby incorporated by reference.

BACKGROUND

With a recent trend toward higher integration and higher density in semiconductor devices, circuit interconnects become finer and finer and the number of levels in multilayer interconnect is increasing. In the process of achieving the multilayer interconnect structure with finer interconnects, film coverage of step geometry (or step coverage) is lowered through thin film formation as the number of interconnect levels increases, because surface steps grow while following surface irregularities on a lower layer. Therefore, in order to fabricate the multilayer interconnect structure, it is necessary to improve the step coverage and planarize the surface in an appropriate process. Further, since finer optical lithography entails shallower depth of focus, it is necessary to planarize surfaces of semiconductor device so that irregularity steps formed thereon fall within a depth of focus in optical lithography.

Accordingly, in a manufacturing process of the semiconductor devices, a planarization technique for a surface of the semiconductor device is becoming more important. The most important technique in this surface planarization is chemical mechanical polishing (CMP). This chemical mechanical polishing (which will be hereinafter called CMP) is a process of polishing a wafer by placing the wafer in sliding contact with a polishing surface of a polishing pad while supplying a polishing liquid containing abrasive grains, such as silica ($SiO_2$), onto the polishing surface.

A polishing apparatus for performing CMP includes a polishing table that supports a polishing pad having a polishing surface, and a polishing head for holding a substrate. Polishing of the substrate using such a polishing apparatus is performed as follows. Slurry is supplied onto the polishing pad while the polishing table is rotated together with the polishing pad. The polishing head presses the substrate against the polishing surface of the polishing pad while the polishing head is rotating the substrate. While the substrate is in sliding contact with the polishing pad in the presence of the slurry, a surface of the substrate is planarized by a combination of a chemical action of the slurry and a mechanical action of abrasive grains contained in the slurry.

During polishing of the substrate, the surface of the substrate is in sliding contact with the rotating polishing pad. As a result, a frictional force acts on the substrate. Thus, in order to prevent the substrate from being moved out of the polishing head during polishing of the substrate, the polishing head includes a retainer ring. This retainer ring is arranged so as to surround the substrate. During polishing of the substrate, the retainer ring presses the polishing pad outside the substrate while the retainer ring is rotating.

Since the retainer ring presses the polishing pad around a wafer, a load of the retainer ring affects a profile of an edge portion of the wafer. In order to positively control the profile of the edge portion of the wafer, a local load may be applied to a part of the retainer ring (see Japanese laid-open patent publication No. 2015-233131).

In Japanese laid-open patent publication No. 2015-233131, a plurality of rollers are arranged above the retainer ring. The rollers are configured to rotate together with the retainer ring. A stationary ring is arranged on the rollers. The stationary ring is coupled to a local-load exerting device and a position of the stationary ring is fixed. The rollers are rotatable while being in rolling contact with the stationary ring. The local-load exerting device exerts a downward local load on a part of the stationary ring. The downward local load is transmitted through the stationary ring and the rollers to the retainer ring. Each roller receives the load of the local-load exerting device only when the roller passes a point of application of the load. In this manner, the local load is applied to a part of the retainer ring.

However, conventionally, even if an abnormality, such as a rotation failure or a breakage, occurs in the roller, there is no means for detecting the abnormality of the roller. As a result, there is a possibility that a normal operation of a polishing apparatus is prevented by continual use of such malfunctioning roller.

SUMMARY OF THE INVENTION

Therefore, there is provided a method of detecting abnormality of a roller which transmits a local load to a retainer ring. In addition, there is provided a polishing apparatus capable of detecting such abnormality of a roller.

Embodiments, which will be described below, relate to a method of detecting abnormality of a roller which transmits a local load to a retainer ring for use in a polishing apparatus for polishing a substrate, such as a wafer. Further, Embodiments, which will be described below, relate to a polishing apparatus capable of detecting such abnormality of a roller.

In an embodiment, there is provided a method comprising: rotating a polishing head which includes a head body and a retainer ring, the head body having a pressing surface for pressing a substrate, the retainer ring being arranged so as to surround the pressing surface; measuring a torque for rotating the polishing head, while rotating a rotary ring together with the polishing head and while exerting a local load to a stationary ring located on the rotary ring, the rotary ring being fixed to the retainer ring and having a plurality of rollers; generating a torque waveform indicating relationship between measured values of the torque and measuring times of the torque; performing Fourier-transform process on the torque waveform to determine an intensity of frequency component of the torque waveform; and determining that at least one of the rollers malfunctions when the determined intensity of the frequency component is larger than a predetermined threshold value.

In an embodiment, the Fourier-transform process is fast-Fourier-transform process.

In an embodiment, measuring of the torque is performed when the polishing head is not holding the substrate and the polishing head is not in contact with a polishing pad having a polishing surface for polishing the substrate.

In an embodiment, determining that at least one of the rollers malfunctions when the determined intensity of the frequency component is larger than the predetermined threshold value comprises determining that at least one of the rollers malfunctions when the intensity of frequency component, corresponding to a rotational speed of the polishing head, is larger than the predetermined threshold value.

In an embodiment, there is provided a polishing apparatus comprising: a polishing head configured to press a substrate against a polishing surface; a rotary ring configured to be rotatable together with the polishing head; a stationary ring located on the rotary ring; a local-load exerting device configured to apply a local load to the stationary ring; a torque measuring device configured to measure a torque for rotating the polishing head; and an abnormality detector coupled to the torque measuring device, wherein the polishing head includes: a head body having a pressing surface configured to press the substrate; and a retainer ring arranged so as to surround the pressing surface, the rotary ring is fixed to the retainer ring and includes a plurality of rollers which are in contact with the stationary ring, the abnormality detector is configured to generate a torque waveform indicating relationship between measured values of the torque and measuring times of the torque, perform Fourier-transform process on the torque waveform to determine an intensity of frequency component of the torque waveform, and determine that at least one of the rollers malfunctions when the determined intensity of the frequency component is larger than a predetermined threshold value.

In an embodiment, the Fourier-transform process is fast-Fourier-transform process.

In an embodiment, the abnormality detector is configured to determine that at least one of the rollers malfunctions when the intensity of frequency component, corresponding to a rotational speed of the polishing head, is larger than the predetermined threshold value.

The torque for rotating the polishing head changes when a malfunctioning roller passes a point of application of the load. According to the present invention, a change in the torque for rotating the polishing head can be detected by performing Fourier-transform process on the torque waveform of the polishing head. As a result, an abnormality of a roller can be detected.

DESCRIPTION OF EMBODIMENTS

Figure 1:
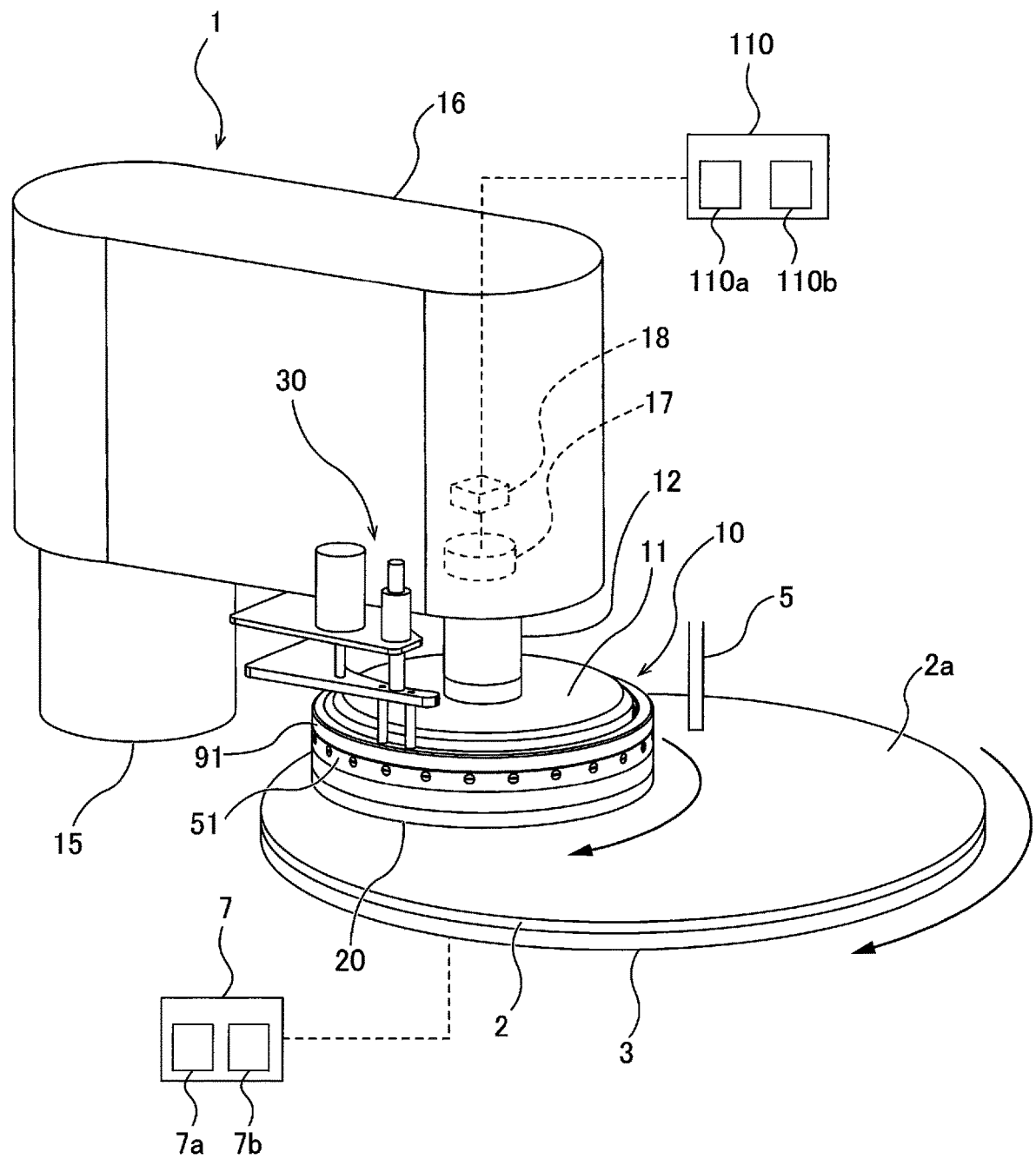
FIG. 1 is a schematic view showing an embodiment of a polishing apparatus.

Embodiments will be described in detail below with reference to the drawings. FIG. 1 is a schematic view showing an embodiment of a polishing apparatus. As shown in FIG. 1, a polishing apparatus 1 includes a polishing head 10 for holding and rotating a wafer which is an example of a substrate, a polishing table 3 for supporting a polishing pad 2 thereon, a polishing-liquid supply nozzle 5 for supplying a polishing liquid (or slurry) onto the polishing pad 2, and an operation controller 7 for controlling an operation of each device of the polishing apparatus 1. The polishing pad 2 has an upper surface which provides a polishing surface 2a for polishing the wafer. The polishing pad 2 is configured to be rotatable together with the polishing table 3.

The operation controller 7 is constituted by at least one computer. The operation controller 7 includes a memory 7a storing programs therein, and an arithmetic device 7b that performs arithmetic operations according to instructions contained in the programs. The arithmetic device 7b includes a CPU (central processing unit), a GPU (graphics processing unit), or the like that performs the arithmetic operations according to the instructions contained in the programs stored in the memory 7a. The memory 7a includes a main memory (for example, a random-access memory) accessible by the arithmetic device 7b, and an auxiliary memory (for example, a hard disk drive or a solid-state drive) that stores data and programs therein.

The polishing apparatus 1 further includes a polishing head shaft 12, a head arm 16, and a torque measuring device 18 for measuring a torque for rotating the polishing head 10. The polishing head 10 is coupled to a lower end of the polishing head shaft 12, which is rotatably held by the head arm 16. In this head arm 16, there are disposed a rotating device 17 for rotating the polishing head shaft 12 and an elevating device (not shown) for elevating and lowering the polishing head shaft 12, and the torque measuring device 18. The polishing head 10 is rotated by the rotating device 17 through the polishing head shaft 12, and is elevated and lowered by the elevating device through the polishing head shaft 12. A rotational speed of the polishing head 10 is controlled by the rotating device 17.

An example of the rotating device 17 may include a combination of a servo-motor and a motor driver. The polishing head 10 is controlled by the rotating device 17 so as to rotate at a constant speed. Therefore, when a torque required to rotate the polishing head 10 at the constant speed changes, a drive current for the servo-motor of the rotating device 17 changes. In this specification, a torque for rotating the polishing head 10 is defined as a physical quantity that directly or indirectly represents a magnitude of a force for rotating the polishing head 10 around its central axis. The torque for rotating the polishing head 10 may be a torque itself for rotating the polishing head 10 around its central axis, or may be a drive current for the servo-motor of the rotating device 17. An example of the torque measuring device 18 may include a current measuring device for measuring the drive current for the servo-motor of the rotating device 17. The current measuring device may be located outside of the head arm 16. In another example, the torque measuring device 18 may be composed of at least a part of the motor driver for driving the servo-motor. In this case, the motor driver determines a current value required to rotate the polishing head 10 at the constant speed, and outputs the determined current value. The determined current value corresponds to the torque for rotating the polishing head 10. In one embodiment, the torque measuring device 18 may be a torque measuring device that directly measures the torque for rotating the polishing head 10 around its central axis.

The head arm 16 is secured to a pivot shaft 15, so that the head arm 16 can move the polishing head 10 outwardly of the polishing table 3 as the pivot shaft 15 rotates. The polishing head 10 is configured to be able to hold the wafer on its lower surface by vacuum suction. The polishing head 10 and the polishing table 3 (and the polishing pad 2) rotate in the same direction as indicated by arrows in FIG. 1. In this state, the polishing head 10 presses the wafer against the polishing surface 2a of the polishing pad 2. The polishing liquid is supplied from the polishing-liquid supply nozzle 5 onto the polishing surface 2a of the polishing pad 2, so that the wafer is polished by the sliding contact with the polishing surface 2a in the presence of the polishing liquid.

The polishing head 10 includes a head body 11 for pressing the wafer against the polishing pad 2, and a retainer ring 20 arranged so as to surround the wafer. The head body 11 and the retainer ring 20 are configured to be rotatable together with the polishing head shaft 12. The retainer ring 20 is configured to be movable in vertical directions independently of the head body 11. The retainer ring 20 projects radially outwardly from the head body 11. During polishing of the wafer, the retainer ring 20 contacts the polishing surface 2a of the polishing pad 2, and presses the polishing pad 2 outside the wafer while the retainer ring 20 is rotating.

The polishing apparatus 1 further includes a rotary ring 51 in which a plurality of rollers (which will be discussed later) are arranged, a stationary ring 91, and an abnormality detector 110 for detecting abnormality of the rollers of the rotary ring 51. The rotary ring 51 is fixed to an upper surface of the retainer ring 20, and is configured to be rotatable together with the retainer ring 20. The stationary ring 91 is located on the rotary ring 51. The rotary ring 51 rotates together with the polishing head 10, while the stationary ring 91 does not rotate and remains stationary. The abnormality detector 110 is coupled to the torque measuring device 18.

The polishing apparatus 1 further includes a local-load exerting device 30 for applying a local load to a part of the stationary ring 91. The local-load exerting device 30 is located above the retainer ring 20 and fixed to the head arm 16. While the retainer ring 20 rotates about its central axis during polishing of the wafer, the local-load exerting device 30 does not rotate together with the retainer ring 20 and remains stationary. The stationary ring 91 is coupled to the local-load exerting device 30.

Figure 2:
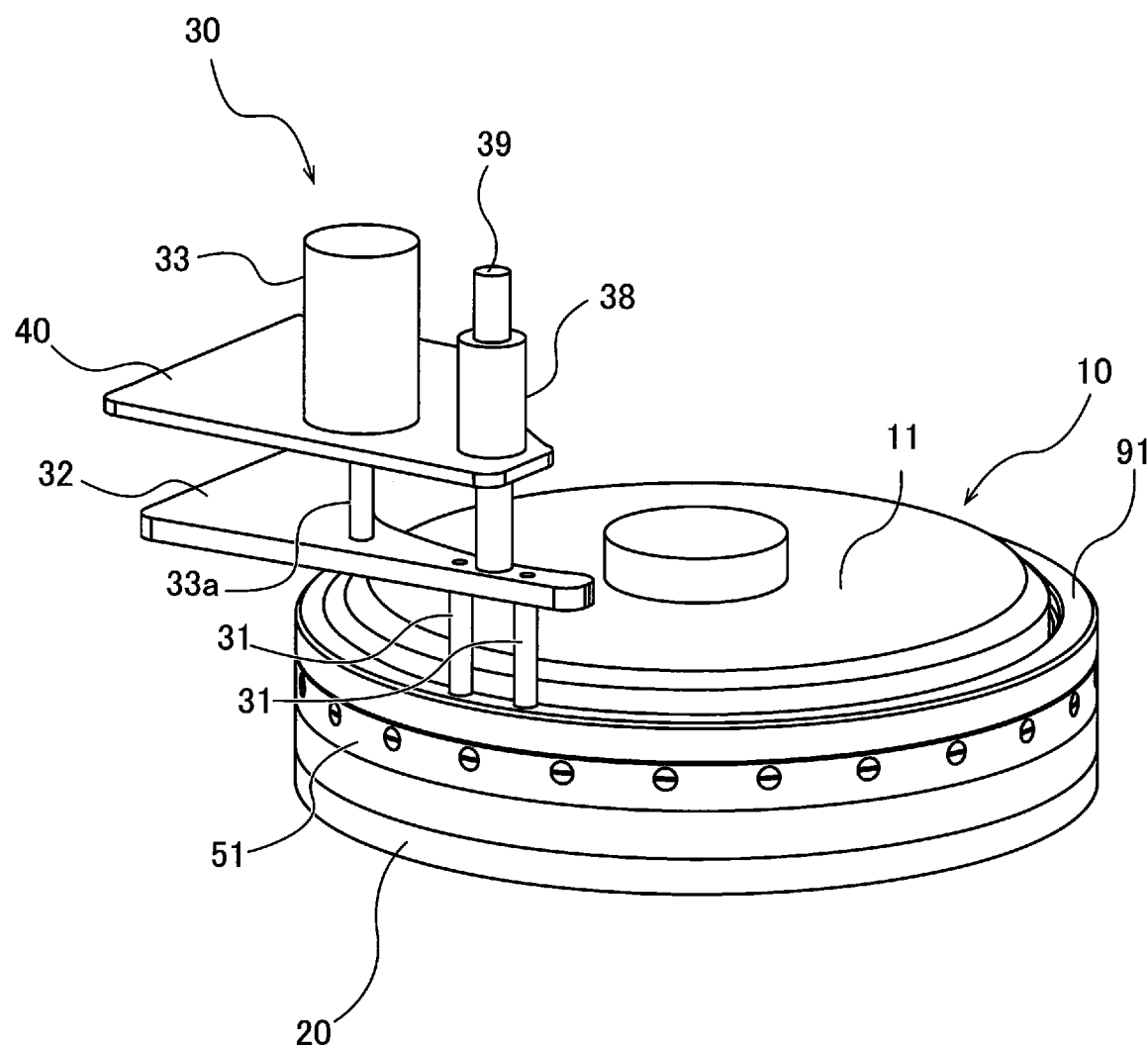
FIG. 2 is a perspective view of a local-load exerting device.

FIG. 2 is a perspective view of the local-load exerting device 30. As shown in FIG. 2, the local-load exerting device 30 includes two push rods 31 for applying a downward local load to the stationary ring 91, a bridge 32, an air cylinder (a load generator) 33, a linear guide 38, a guide rod 39, and a unit base 40.

The unit base 40 is fixed to the head arm 16 (see FIG. 1). The air cylinder 33 and the linear guide 38 are mounted to the unit base 40. The piston rod 33a of the air cylinder 33 and the guide rod 39 are coupled to the bridge 32. The guide rod 39 is vertically movably supported by the linear guide 38 with low friction.

The air cylinder 33 is coupled to a pressure regulator (not shown) and an air vent mechanism (not shown). The air cylinder 33 is configured to be able to generate a load. The air cylinder 33 generates the load that is transmitted to the bridge 32. The bridge 32 is coupled to the stationary ring 91 through the two push rods (which constitute a pressing member) 31, which transmit the load, applied from the air cylinder 33 to the bridge 32, to the stationary ring 91. In this manner, the push rods 31 apply a local load to a part of the stationary ring 91.

While the polishing head 10 rotates about its own central axis, the local-load exerting device 30 does not rotate with the polishing head 10, because the local-load exerting device 30 is secured to the head arm 16. Specifically, during polishing of the wafer, the polishing head 10 and the wafer rotate, while the local-load exerting device 30 is stationary at a predetermined position. Similarly, during polishing of the wafer, the rotary ring 51 rotates together with the polishing head 10, while the stationary ring 91 is stationary at a predetermined position.

The local-load exerting device 30 exerts the downward local load on a part of the stationary ring 91. The downward local load is transmitted through the stationary ring 91 and the rotary ring 51 to the retainer ring 20. In this manner, the local-load exerting device 30 exerts the downward local load on a part of the retainer ring 20 through the stationary ring 91 and the rotary ring 51.

The polishing apparatus 1 polishes the wafer while rotating the rotary ring 51 together with the polishing head 10 and applying the local load to the stationary ring 91 from the push rods 31 of the local-load exerting device 30. During polishing of the wafer, the retainer ring 20 contacts the polishing surface 2a of the polishing pad 2, presses the polishing pad 2 outside the wafer while rotating, and applies the downward local load on a part of the polishing surface 2a. The reason for applying the downward local load to a part of the retainer ring 20 during polishing of the wafer is to positively control a profile of a periphery (an edge portion) of the wafer. In one embodiment, the polishing apparatus 1 may include a plurality of local-load exerting devices 30. By selectively applying a local load to any one of a plurality of locations of the retainer ring 20, the profile of the periphery of the wafer can be controlled more precisely.

Figure 3:
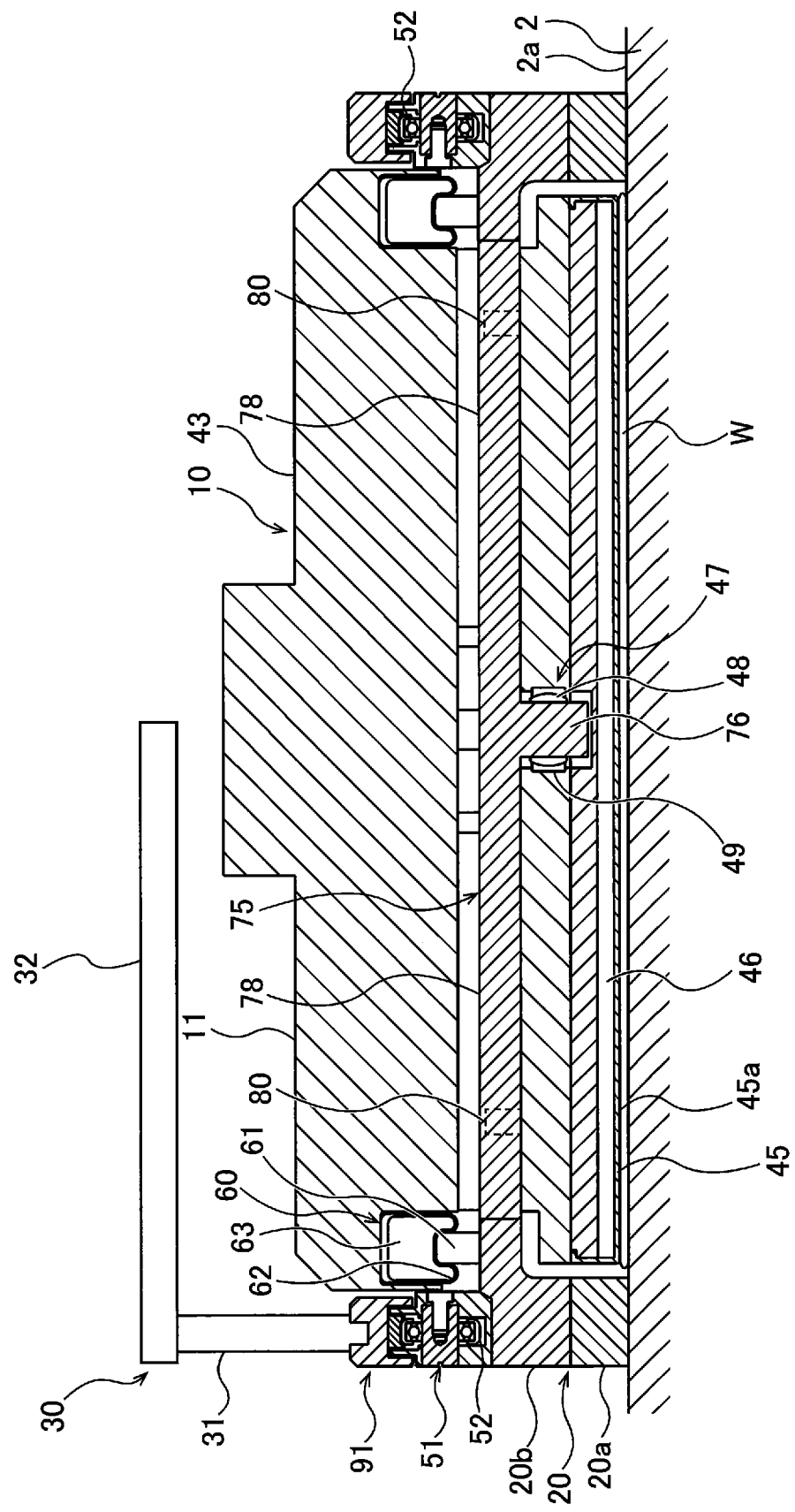
FIG. 3 is a cross-sectional view of a polishing head.

Next, the details of the polishing head 10 will be described. FIG. 3 is a cross-sectional view of the polishing head 10. This polishing head 10 includes the head body 11 and the retainer ring 20. The head body 11 includes a carrier 43 coupled to the polishing head shaft 12 (see FIG. 1), an elastic membrane (or a membrane) 45 attached to a lower surface of the carrier 43, and a spherical bearing 47 supporting the retainer ring 20 while allowing the retainer ring 20 to tilt and move in vertical directions relative to the carrier 43. The retainer ring 20 is coupled to and supported by the spherical bearing 47 through a coupling member 75. This coupling member 75 is disposed in the carrier 43 and is vertically movable in the carrier 43.

The elastic membrane 45 has a lower surface that provides a pressing surface 45a. This pressing surface 45a is brought into contact with an upper surface (a surface at an opposite side from a surface to be polished) of the wafer W. The elastic membrane 45 has a plurality of through-holes (not shown). A pressure chamber 46 is formed between the carrier 43 and the elastic membrane 45. This pressure chamber 46 is in a fluid communication with a pressure regulator (not shown). When a pressurized fluid (e.g., a pressurized air) is supplied into the pressure chamber 46, the pressing surface 45a of the elastic membrane 45 receives the pressure of the fluid in the pressure chamber 46, thus pressing the wafer W against the polishing surface 2a of the polishing pad 2. When negative pressure is developed in the pressure chamber 46, the wafer W is held on the pressing surface 45a of the elastic membrane 45 by the vacuum suction. In one embodiment, a plurality of pressure chambers may be provided between the carrier 43 and the elastic membrane 45.

The retainer ring 20 is arranged so as to surround the wafer W and the pressing surface 45a of the elastic membrane 45. The retainer ring 20 has a ring member 20a that is to touch the polishing pad 2, and a drive ring 20b fixed to an upper portion of the ring member 20a. The ring member 20a is secured to the drive ring 20b by a plurality of bolts (now shown). The ring member 20a is arranged so as to surround the peripheral edge of the wafer W and the pressing surface 45a of the elastic membrane 45.

The coupling member 75 includes a shaft portion 76 located in the center of the head body 11, and a plurality of spokes 78 extending radially from the shaft portion 76. The shaft portion 76 extends in the vertical direction through the spherical bearing 47 that is located in the center of the head body 11. The shaft portion 76 is supported by the spherical bearing 47 such that the shaft portion 76 can be movable in the vertical directions. The drive ring 20b is connected to the spokes 78. With these configurations, the coupling member 75 and the retainer ring 20, which is coupled to the coupling member 75, can move relative to the head body 11 in the vertical directions.

The spherical bearing 47 includes an inner race 48, and an outer race 49 that slidably supports an outer circumferential surface of the inner race 48. The inner race 48 is coupled to the retainer ring 20 through the coupling member 75. The outer race 49 is fixed to the carrier 43. The shaft portion 76 of the coupling member 75 is supported by the inner race 48 such that the shaft portion 76 can move in the vertical directions. The retainer ring 20 is tiltably supported by the spherical bearing 47 through the coupling member 75.

The spherical bearing 47 is configured to allow the retainer ring 20 to move in the vertical directions and tilt, while restricting a lateral movement (horizontal movement) of the retainer ring 20. During polishing of the wafer W, the retainer ring 20 receives from the wafer W a lateral force (an outward force in the radial direction of the wafer W) that is generated due to the friction between the wafer W and the polishing pad 2. This lateral force is bore or received by the spherical bearing 47. In this manner, the spherical bearing 47 serves as a bearing device configured to receive the lateral force (the outward force in the radial direction of the wafer W) that is applied from the wafer W to the retainer ring 20 due to the friction between the wafer W and the polishing pad 2 during polishing of the wafer W, while restricting the lateral movement of the retainer ring 20 (i.e., fixing the horizontal position of the retainer ring 20).

Plural pairs of drive collars 80 are fixed to the carrier 43. Each pair of drive collars 80 are arranged on both sides of each spoke 78. The rotation of the carrier 43 is transmitted through the drive collars 80 to the retainer ring 20, so that the head body 11 and the retainer ring 20 can rotate together. The drive collars 80 are just in contact with the spokes 78 and do not prevent the vertical movement and the tilt of the coupling member 75 and the retainer ring 20.

The upper portion of the retainer ring 20 is coupled to an annular retainer-ring pressing mechanism 60, which is configured to exert a uniform downward load on an entire upper surface of the retainer ring 20 (more specifically, an upper surface of the drive ring 20b) to thereby press a lower surface of the retainer ring 20 (i.e., a lower surface of the ring member 20a) against the polishing surface 2a of the polishing pad 2.

The retainer-ring pressing mechanism 60 includes an annular piston 61 secured to the upper portion of the drive ring 20b, and an annular rolling diaphragm 62 connected to an upper surface of the piston 61. The rolling diaphragm 62 forms a pressure chamber 63 therein. This pressure chamber 63 is coupled to a pressure regulator (not shown). When a pressurized fluid (e.g., pressurized air) is supplied into the pressure chamber 63, the rolling diaphragm 62 pushes down the piston 61, which in turn pushes down the entirety of the retainer ring 20. In this manner, the retainer-ring pressing mechanism 60 presses the lower surface of the retainer ring 20 against the polishing surface 2a of the polishing pad 2.

Figure 4:
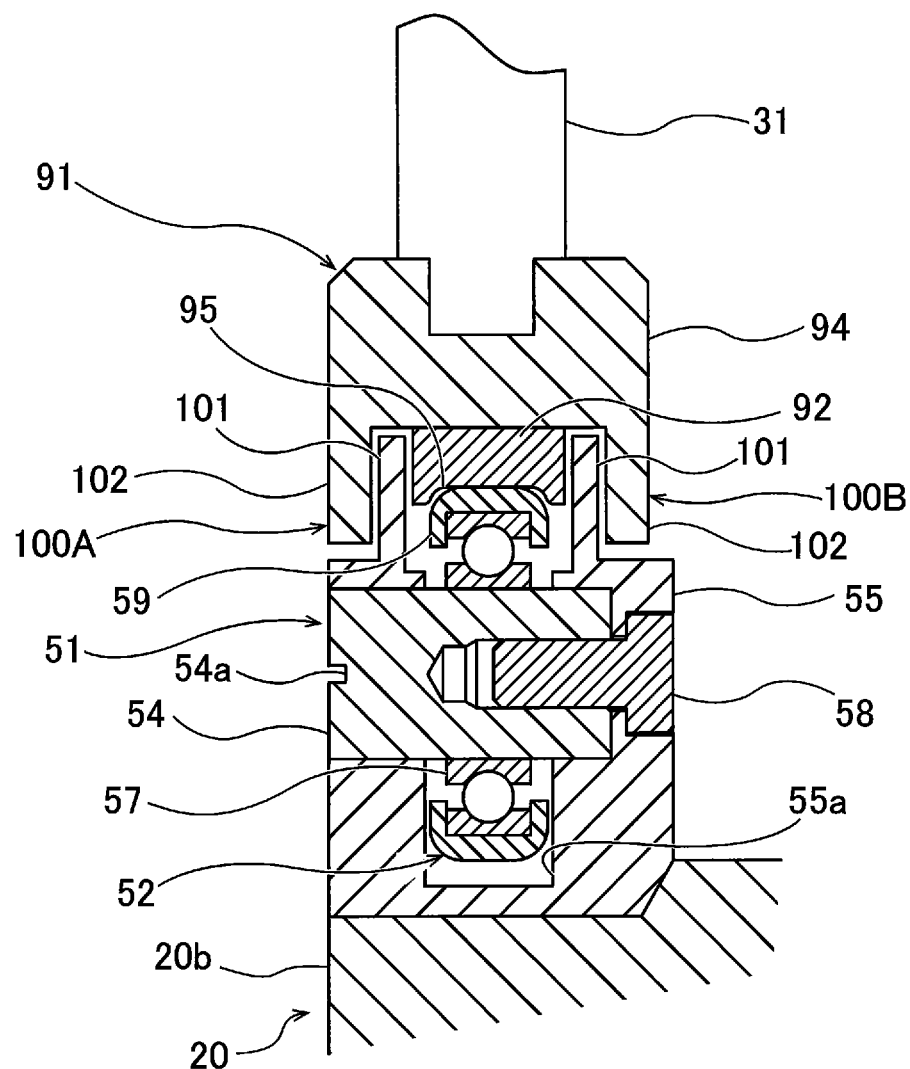
FIG. 4 is a cross-sectional view of a rotary ring and a stationary ring.

FIG. 4 is a cross-sectional view of the rotary ring 51 and the stationary ring 91. The rotary ring 51 includes a plurality of rollers 52, roller shafts 54 that support the rollers 52 respectively, and a roller housing 55 to which the roller shafts 54 are fixed. In FIG. 4, only one roller 52 and one roller shaft 54 are depicted. The roller housing 55 has an annular shape and is fixed to the upper surface of the retainer ring 20. Each roller 52 has a bearing 57 mounted to the roller shaft 54 so that the roller 52 can rotate around the roller shaft 54.

The stationary ring 91 includes an annular rail 92 which is in contact with tops of the rollers 52, and an annular rail base 94 to which the annular rail 92 is fixed. An annular groove 95 is formed in a lower surface of the annular rail 92, and the tops of the rollers 52 are in contact with the annular groove 95. The rollers 52 are rotatable while being in rolling contact with the annular rail 92. The push rods 31 are coupled to the top portion of the rail base 94.

The roller shaft 54 that extends through an inner race of the bearing 57 of each roller 52 is supported by an inner wall and an outer wall of the roller housing 55 and is fixed by a screw 58 inserted into the inner wall. Thus, a female screw is formed in the roller shaft 54. A groove 54a, into which a flathead screwdriver fits to avoid free spinning of the screw 58 upon tightening of it, is formed on the opposite side of the screw 58 from the female screw. The rotary ring 51 is placed on the upper surface of the drive ring 20b of the retainer ring 20. The relative positions of the drive ring 20b and the rotary ring 51 are fixed by positioning pins (not shown) so that the rotary ring 51 does not slip relative to the retainer ring 20.

Each roller 52 includes the bearing 57 mounted to the roller shaft 54, and a wheel 59 secured to an outer race of the bearing 57. The wheel 59 is formed of a resin having a high abrasion resistance, such as polyacetal, PET (polyethylene terephthalate), PPS (polyethylene sulfide), or MC Nylon (registered trademark). The annular rail 92 is preferably formed of a metal having a high corrosion resistance, such as stainless steel (SUS 304). A single-row deep-groove ball bearing is used as the bearing 57. The wheel 59 is mounted to the bearing 57 by pressing the outer race of the bearing 57 into the resin wheel 59.

An annular recess 55a is formed in the roller housing 55, and the multiple rollers 52 are housed in this annular recess 55a. The lower surface and both side surfaces of each roller 52 are surrounded by the annular recess 55a. Seals 100A, 100B are disposed between the roller housing 55 of the rotary ring 51 and the rail base 94 of the stationary ring 91. More specifically, the outer seal 100A is located outside the annular rail 92, and the inner seal 100B is located inside the annular rail 92. There is no opening in both side surfaces and a bottom surface that form the annular recess 55a, and the seals 100A, 100B are provided between the stationary ring 91 and the rotary ring 51. Therefore, wear particles, generated from the rollers 52 and the annular rail 92, are confined in the annular recess 55a and do not fall onto the polishing pad 2.

In the embodiment illustrated in FIG. 4, the outer seal 100A and the inner seal 100B are labyrinth seals. The outer seal 100A includes a first circumferential wall 101 located outside the annular rail 92, and a second circumferential wall 102 located outside the first circumferential wall 101. The first circumferential wall 101 extends upward from the roller housing 55 and is formed integrally with the roller housing 55. The second circumferential wall 102 extends downward from the rail base 94 and is formed integrally with the rail base 94. A very small gap is formed between the first circumferential wall 101 and the second circumferential wall 102. Likewise, the inner seal 100B includes a first circumferential wall 101 located inside the annular rail 92, and a second circumferential wall 102 located inside the first circumferential wall 101.

Figure 5:
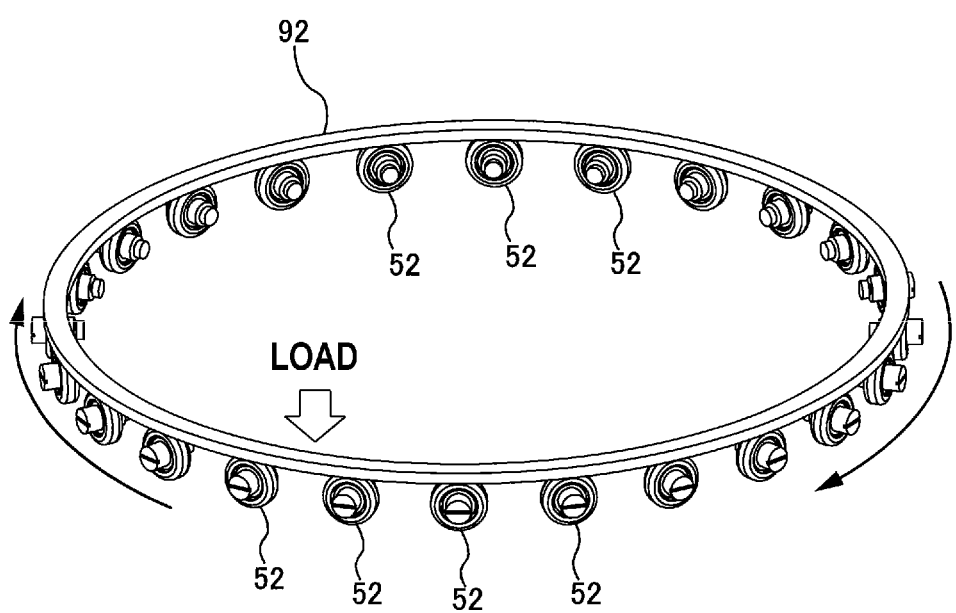
FIG. 5 is a perspective view of rollers and an annular rail.
Figure 6:
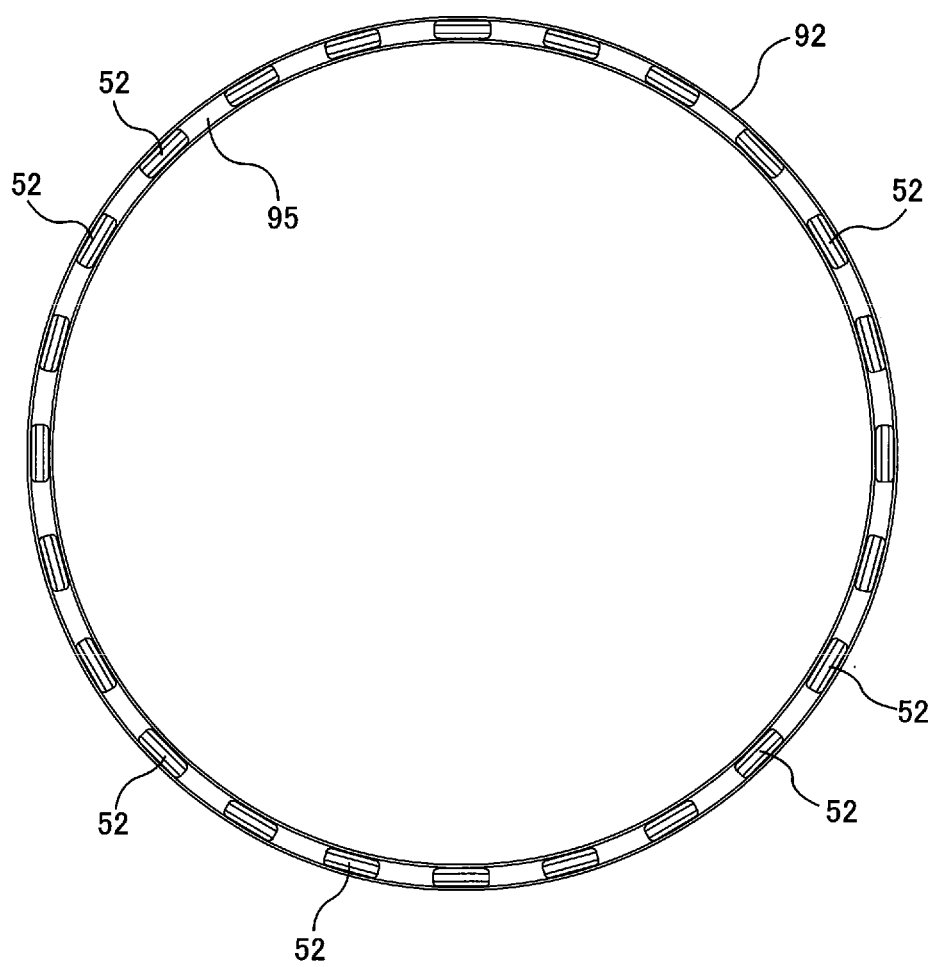
FIG. 6 is a diagram of the rollers and the annular rail of FIG. 5, as viewed from below.

FIG. 5 is a perspective view of the rollers 52 and the annular rail 92, and FIG. 6 is a diagram of the rollers 52 and the annular rail 92 of FIG. 5, as viewed from below. In this embodiment the rotary ring 51 has 24 rollers 52. During polishing of a wafer, the rollers 52 rotate together with the retainer ring 20, while the annular rail 92 remains stationary. Accordingly, each roller 52 makes rolling contact with the annular rail 92. With a construction of the roller 52 described with reference to FIG. 4, the roller 52 can rotate smoothly and can transmit a load without damaging the annular rail 92. Each roller 52 receives the load only when the roller 52 passes a point of application of the load (just below the push rods 31). The downward local load of the local-load exerting device 30 is transmitted from the annular rail 92 to the rollers 52 and transmitted through the rollers 52 to the retainer ring 20.

The number of rollers 52 is determined based on the diameter of the roller 52 and the diameter of the annular rail 92. To achieve a smooth transmission of the load, it is preferred to use as many rollers 52 as possible so as to minimize a distance between adjacent rollers 52. Each roller 52 has a smooth circumferential surface, and is in contact with the annular rail 92 in a wide contact area so that the roller 52 can transmit a larger load. The annular rail 92 is placed on the rollers 52. The rollers 52 make rolling contact with the annular rail 92. A lateral position of the annular rail 92 is guided by contact between a corner, having a curved cross-sectional shape, of each roller 52 and a corner, having a curved cross-sectional shape, of the annular rail 92. In this case, the load of the local-load exerting device 30 is mainly transmitted from the annular rail 92 to the circumferential surface of each roller 52.

As described above, the polishing apparatus 1 further includes the abnormality detector 110 for detecting abnormality of the rollers 52 (see FIG. 1). As shown in FIG. 1, the abnormality detector 110 is configured to generate a torque waveform indicating relationship between measured values of the torque for rotating the polishing head 10 and measuring times of the torque for rotating the polishing head 10 (this torque waveform may be hereinafter referred to as a torque waveform of the polishing head 10), determine an intensity of a frequency component of the torque waveform of the polishing head 10, and determine the presence or absence of the abnormality of the roller 52 based on the determined intensity of the frequency component.

More specifically, the abnormality detector 110 includes a memory 110a storing therein programs for generating the torque waveform of the polishing head 10, determining the intensity of frequency component of the torque waveform of the polishing head 10, and determining the presence or absence of the abnormality of the rollers 52 based on the determined intensity of the frequency component. The abnormality detector 110 further includes an arithmetic device 110b that performs arithmetic operations according to instructions contained in the programs. The arithmetic device 110b includes a CPU (central processing unit), a GPU (graphics processing unit), or the like that performs the arithmetic operations according to the instructions contained in the programs stored in the memory 110a. The memory 110a includes a main memory (for example, a random-access memory) accessible by the arithmetic device 110b, and an auxiliary memory (for example, a hard disk drive or a solid-state drive) that stores data and programs therein.

The programs include a program for performing Fourier-transform process on the torque waveform of the polishing head 10 to determine the intensity of the frequency component of the torque waveform of the polishing head 10, and a program for determining that at least one of the rollers 52 malfunctions when the determined intensity of the frequency component is larger than a predetermined threshold value. An example of Fourier-transform process may include fast-Fourier-transform (FFT) process.

Figure 7:
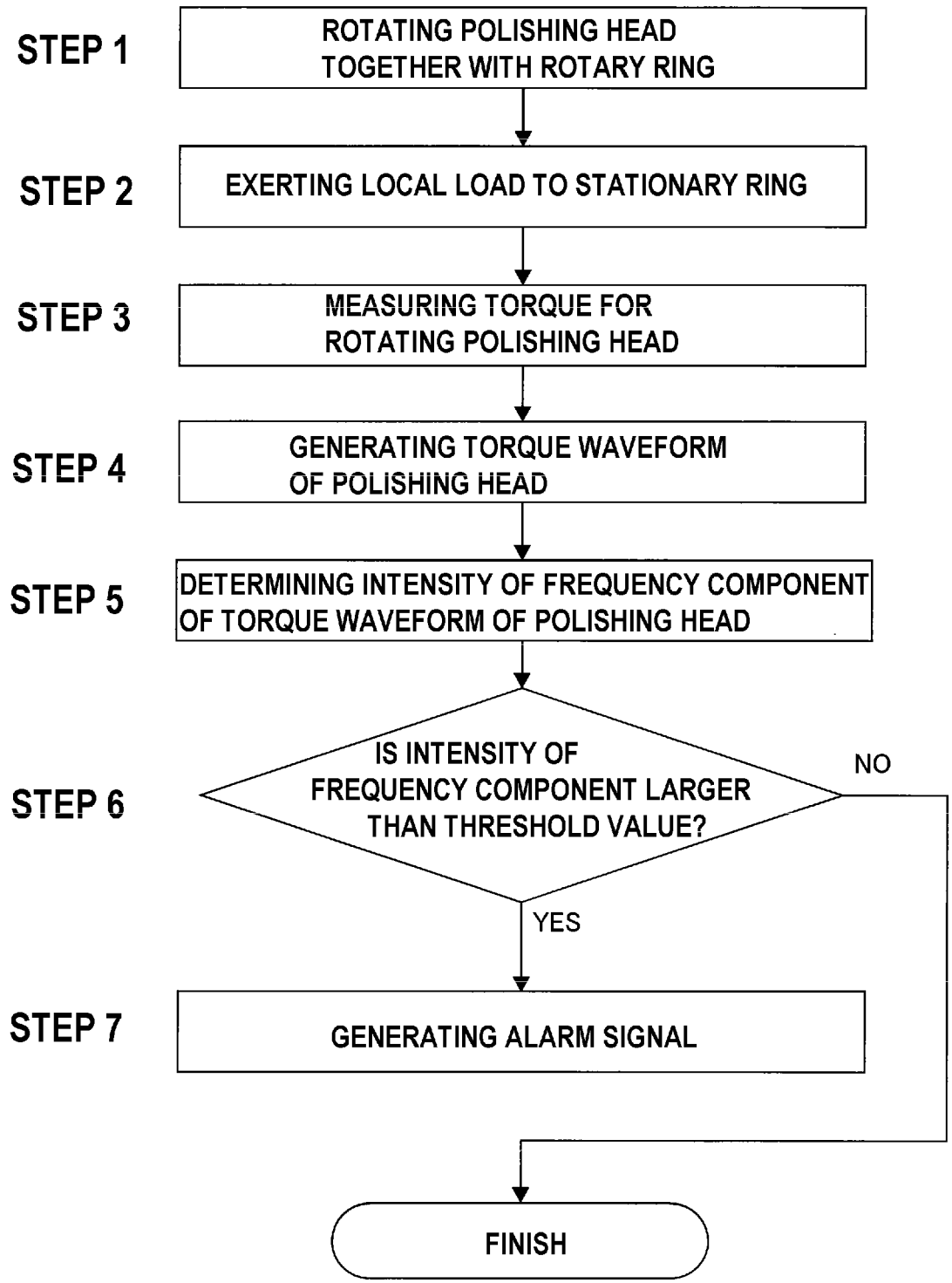
FIG. 7 is a flow chart showing an embodiment of a method of detecting abnormality of a roller.

Next, a method of detecting abnormality of the roller 52 will be described. FIG. 7 is a flow chart showing an embodiment of the method of detecting abnormality of the roller 52. An abnormality detection of the roller 52 described with reference to FIG. 7, particularly the measurement of the torque for rotating the polishing head 10, is performed when the polishing head 10 is not holding the wafer and the polishing head 10 is not in contact with the polishing pad 2. As an example, the abnormality detection of the roller 52 is performed during cleaning of the polishing head 10, which is performed for the purpose of rinsing off the polishing liquid or the like adhering to the polishing head 10 after polishing the wafer. The abnormality detection of the roller 52 may be performed during cleaning of the polishing head 10, after a predetermined number of wafers are polished or each time cleaning of the polishing head 10 is performed.

In step 1, the operation controller 7 instructs the rotating device 17 to rotate the polishing head 10 together with the rotary ring 51 at a preset rotational speed. In step 2, the operation controller 7 instructs the local-load exerting device 30 to exert a local load of a preset magnitude to the stationary ring 91.

In step 3, the torque for rotating the polishing head 10 is measured. More specifically, the torque for rotating the polishing head 10 is measured by the torque measuring device 18 while the polishing head 10 is rotating together with the rotary ring 51 and a local load is exerted to the stationary ring 91 by the local-load exerting device 30.

In step 4, the abnormality detector 110 obtains the measured values of the torque for rotating the polishing head 10 from the torque measuring device 18, and generates a torque waveform (a torque waveform of the polishing head 10) indicating the relationship between the measured values of the torque for rotating the polishing head 10 and measuring times of the torque for rotating the polishing head 10.

Figure 8:
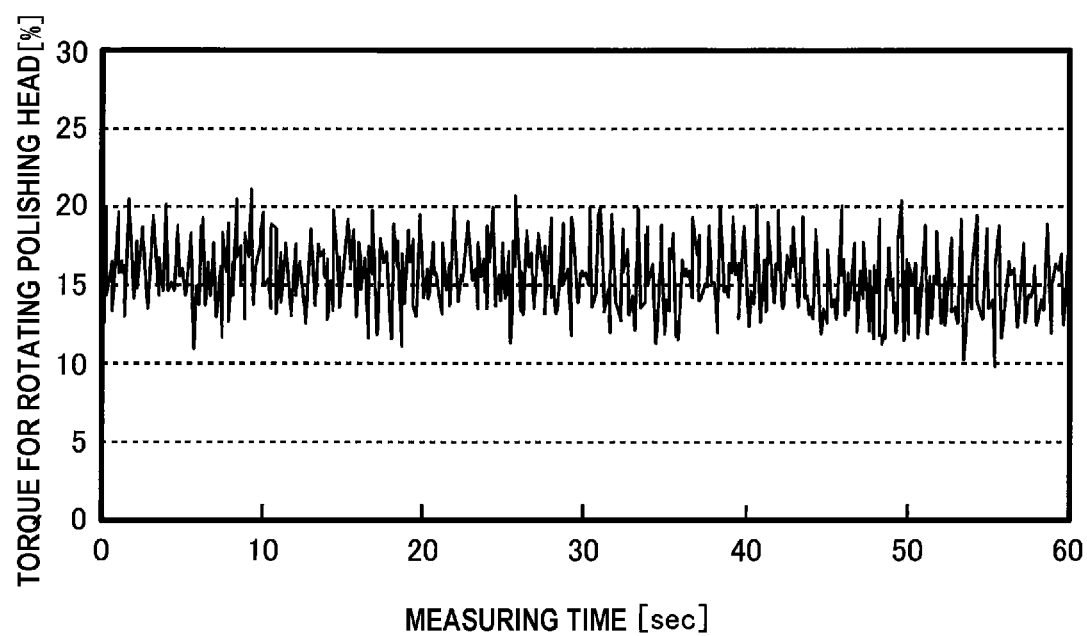
FIG. 8 shows an example of a torque waveform.

FIG. 8 shows an example of the torque waveform of the polishing head 10. FIG. 8 shows a torque waveform of the polishing head 10 when abnormalities (rotation failures) occur in adjacent 10 out of 24 rollers 52. More specifically, the torque waveform shown in FIG. 8 is a torque waveform of the polishing head 10 when a local load of 300 N is applied to the stationary ring 91 for 60 seconds while the polishing head 10 is rotating at 80 $min^{-1}$.

When the rollers 52 are normal, the rollers 52 make rolling contact with the annular rail 92. Therefore, the rollers 52 pass the point of application of the load (just below the push rods 31) while rotating smoothly. However, when some rollers 52 malfunction due to rotation failures or other cause, such malfunctioning rollers 52 cannot rotate smoothly and as a result, the torque for rotating the polishing head 10 changes when the malfunctioning roller 52 passes the point of application of the load. Therefore, the abnormality detector 110 can detect the abnormality of each roller 52 from the change in the torque for rotating the polishing head 10.

As described above, the torque for rotating the polishing head 10 changes when the abnormal roller 52 passes the point of application of the load. Accordingly, the torque for rotating the polishing head 10 changes periodically when an abnormality is present in at least one of the rollers 52.

In step 5 of FIG. 7, in order to detect a periodic change in the torque for rotating the polishing head 10, the abnormality detector 110 performs Fourier-transform process on the torque waveform of the polishing head 10 to determine intensity of the frequency component of the torque waveform of the polishing head 10. More specifically, the abnormality detector 110 performs fast-Fourier-transform (FFT) process on the torque waveform of the polishing head 10 to determine the intensity of the frequency component of the torque waveform of the polishing head 10.

Figure 9:
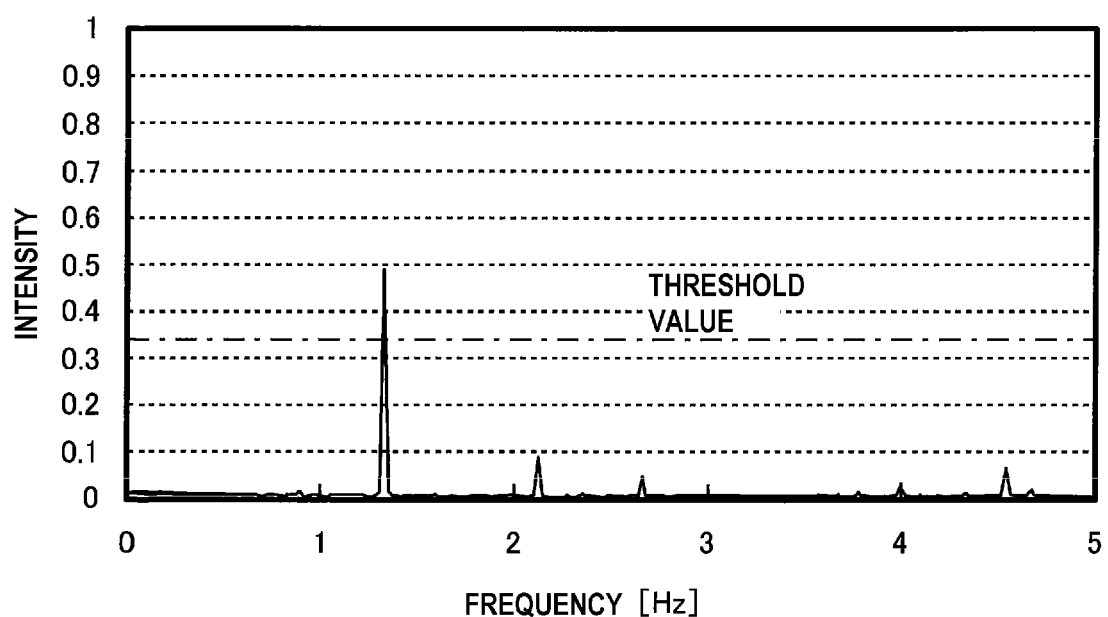
FIG. 9 is a diagram showing intensities of frequency components of the torque waveform of the polishing head when FFT process is performed on the torque waveform of FIG. 8.

FIG. 9 is a diagram showing the intensity of the frequency component of the torque waveform of the polishing head 10 when the torque waveform of FIG. 8 is performed FFT process. In FIG. 9, the intensity of the frequency component around 1.3 Hz, which corresponds to 80 $\min^{-1}$, is relatively large. This result indicates that the torque for rotating the polishing head 10 changes at a cycle corresponding to the rotational speed of the polishing head 10, i.e., the torque for rotating the polishing head 10 changes when the abnormal roller 52 passes the point of application of the load.

In step 6 of FIG. 7, the abnormality detector 110 compares the intensity of the frequency component determined in the step 5 with a predetermined threshold value. The abnormality detector 110 determines that at least one of the rollers 52 is abnormal when the determined intensity of the frequency component is larger than the predetermined threshold value.

In one embodiment, the abnormality detector 110 may determine that at least one of the plurality of rollers 52 is abnormal when an intensity of a frequency component, corresponding to the rotational speed of the polishing head 10, is larger than a predetermined threshold value. Further, in one embodiment, the abnormality detector 110 may generate an alarm signal to urge an operator to inspect the roller 52 when the abnormality detector 110 determines that the roller 52 is abnormal (step 7).

As described above, when the abnormal roller 52 passes the point of application of the load, the torque for rotating the polishing head 10 changes. According to the above-described embodiments, the abnormality detector 110 can detect a change in the torque for rotating the polishing head 10 by performing Fourier-transform process on the torque waveform of the polishing head 10. As a result, the abnormality detector 110 can detect the abnormality of each roller 52.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method comprising: rotating a polishing head which includes a head body and a retainer ring, the head body having a pressing surface for pressing a substrate, the retainer ring being arranged so as to surround the pressing surface; measuring a torque for rotating the polishing head, while rotating a rotary ring together with the polishing head and while exerting a local load to a stationary ring located on the rotary ring, the rotary ring being fixed to the retainer ring and having a plurality of rollers wherein measuring of the torque is performed when the polishing head is not holding the substrate and the polishing head is not in contact with a polishing pad having a polishing surface for polishing the substrate; generating a torque waveform indicating relationship between measured values of the torque and measuring times of the torque; performing Fourier-transform process on the torque waveform to determine an intensity of frequency component of the torque waveform; and determining that at least one of the rollers malfunctions when the determined intensity of the frequency component is larger than a predetermined threshold value.

2. The method according to claim 1, wherein the Fourier-transform process is fast-Fourier-transform process.

3. The method according to claim 1, wherein determining that at least one of the rollers malfunctions when the determined intensity of the frequency component is larger than the predetermined threshold value comprises determining that at least one of the rollers malfunctions when the intensity of frequency component, corresponding to a rotational speed of the polishing head, is larger than the predetermined threshold value.

4. A polishing apparatus comprising: a polishing head configured to press a substrate against a polishing surface; a rotary ring configured to be rotatable together with the polishing head; a stationary ring located on the rotary ring; a local-load exerting device configured to apply a local load to the stationary ring; a torque measuring device configured to measure a torque for rotating the polishing head when the polishing head is not holding the substrate and the polishing head is not in contact with a polishing pad having a polishing surface for polishing the substrate; and an abnormality detector coupled to the torque measuring device, wherein the polishing head includes: a head body having a pressing surface configured to press the substrate; and a retainer ring arranged so as to surround the pressing surface, the rotary ring is fixed to the retainer ring and includes a plurality of rollers which are in contact with the stationary ring, the abnormality detector is configured to generate a torque waveform indicating relationship between measured values of the torque and measuring times of the torque, perform Fourier-transform process on the torque waveform to determine an intensity of frequency component of the torque waveform, and determine that at least one of the rollers malfunctions when the determined intensity of the frequency component is larger than a predetermined threshold value.

5. The polishing apparatus according to claim 4, wherein the Fourier-transform process is fast-Fourier-transform process.

6. The polishing apparatus according to claim 4, wherein the abnormality detector is configured to determine that at least one of the rollers malfunctions when the intensity of frequency component, corresponding to a rotational speed of the polishing head, is larger than the predetermined threshold value.

* * * * *